(12) United States Patent
Qu et al.

(10) Patent No.: US 6,825,733 B1
(45) Date of Patent: Nov. 30, 2004

(54) LOW JITTER INTEGRATED PHASE LOCKED LOOP WITH BROAD TUNING RANGE

(75) Inventors: Ming Qu, San Jose, CA (US); Ji Zhao, San Jose, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 10/300,190

(22) Filed: Nov. 20, 2002

Related U.S. Application Data

(63) Continuation of application No. 09/870,877, filed on May 30, 2001, now Pat. No. 6,498,538.

(51) Int. Cl.[7] ............................................. H03B 21/00
(52) U.S. Cl. ..................... 331/57; 331/17; 331/DIG. 2; 331/74
(58) Field of Search ............................ 331/17, 57, 74, 331/DIG. 2

(56) References Cited

U.S. PATENT DOCUMENTS 3,909,735 A      9/1975  Anderson et al.
4,131,862 A  * 12/1978  Black et al. ................... 331/4

* cited by examiner

*Primary Examiner*—Arnold Kinkead

(57) ABSTRACT

System and method for providing a low noise signal having a broad tuning range (1 GHz to 10 GHz, or larger), with associated jitter no more than about 10 percent of the selected period of a target output signal. In a first stage, a ring-based VCO phase locked loop system provides a broad tuning range with some associated noise, and a second stage in a first state is relatively transparent, with no substantial differential attenuation based on frequency. After phase lock is achieved, the second stage is switched to a second state with low associated noise and high differential attenuation based on input signal frequency.

17 Claims, 2 Drawing Sheets

LOW JITTER INTEGRATED PHASE LOCKED LOOP WITH BROAD TUNING RANGE

RELATED U.S. APPLICATION DATA

This is a continuation of application Ser. No. 09/870,877, filed May 30, 2001, now U.S. Pat. No. 6,498,538.

FIELD OF THE INVENTION

This invention relates to tuning of, and noise suppression in phase locked loop systems used in signal transmitters and receivers.

BACKGROUND OF THE INVENTION

Provision of a low jitter phase locked loop (PLL) system is critical in many transmitter and receiver system, in order to provide accurate timing information for many communication systems. A PLL system of a first design, using a ring-based voltage controlled oscillator (VCO) can provide a wide frequency tuning range but behaves as a high pass filter for noise that appears in a VCO. Ideally, the associated signal jitter should be no more than 1–10 percent of the period T of the target frequency or frequencies at which such a system is to operate. This jitter figure of merit cannot be achieved, or even approached, using a ring-based VCO, as the operating frequency increases.

What is needed is a PLL system that provides a broad tuning range. preferably from about 1 GHz to about 10 Ghz for an optical transmission system, and provides signals with relatively low jitter, $\Delta T$ (jitter) $\leq 0.01$ T–0.1 T. Preferably, the system should allow selection of one or more target frequencies within this tuning range and should have an associated signal processing time delay that is approximately constant over the tuning range. Preferably, the system should have an associated time delay that does not vary strongly with the target frequency.

SUMMARY OF THE INVENTION

These needs are met by the invention, which combines two types of VCO mechanisms, one being switchable, to provide a versatile, low jitter PLL system with wide tuning range. A first stage of the system includes a ring-based VCO mechanism having a tuning range that can extend to, or beyond, 1 GHz–10 Ghz. The first stage is preferably used for initial signal acquisition and lock onto one or more frequencies in a selected sub-range. A second stage of the system includes one or more LC tank circuits that are switchable into and out of the system. With the LC tank circuit(s) switched out of the system (first state), this circuit becomes transparent, and the initial acquisition and frequency lock are implemented with no differential attenuation based on frequency. With the LC tank circuit(s) switched into the system (second state), the initially acquired signal frequency or frequencies are subjected to narrow bandwidth tuning that suppresses sideband frequency components in the acquired signal and passes frequencies within a narrow band that includes a selected target or resonant frequency.

DESCRIPTION OF BEST MODES OF THE INVENTION

Figure 1:
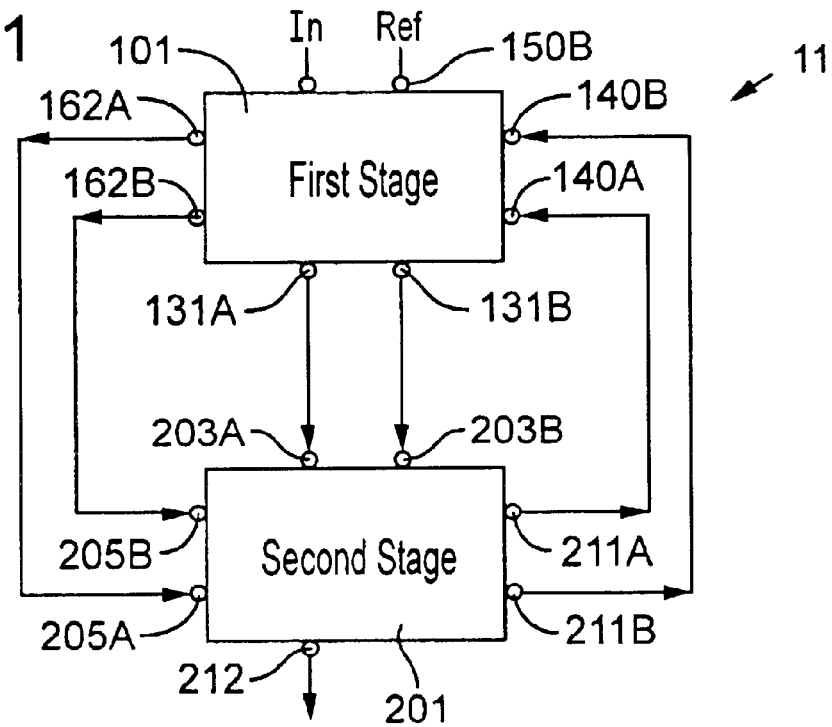
FIG. 1 illustrates schematically an embodiment of the invention.

FIG. 1 schematically illustrates an embodiment 11 of the invention, including a ring-based VCO mechanism in a first stage 101 of a phase locked loop (PLL) system, and a second stage including a switchable LC tank-based bandpass filter mechanism 201. An input signal is received at an input signal terminal 102 of the first stage and is processed for initial signal frequency acquisition. This first stage 101 has a broad tuning range, from about 1 GHz to 10 GHz, or larger if desired. The first stage 101 has an estimated time delay for signal acquisition and processing $\Delta t$(delay; 1) in a range of 1–10 µsec. A first stage intermediate output signal is provided at one or more first stage intermediate output signal terminals, 131A and 131B. The first stage 101 provides one or more first stage control output signals at control output terminals, 162A and 162B.

The second stage 201 receives the first stage intermediate output signals at second stage intermediate input signal terminals, 203A and 203B. The second stage 201 also receives one or more first stage control signals at second stage control input terminals, 205A and 205B, which are connected to the respective first stage control output terminals, 162A and 162B. The second stage 201 includes one or more switchable LC tank-based circuits arranged in parallel with one or more resistive circuits, connected to the second stage first and second input terminals, 203A and 203B, and connected to one or more second stage intermediate output terminals, 211A and 211B. One or both intermediate output signal terminal(s), 211A and 211B, are connected to intermediate input signal terminals, 140A and/or 140B, respectively, of the first stage 101.

With the second stage 201 in a first signal processing state, all LC tank-based circuits are inactivated, and the second stage has a frequency response that is approximately constant (no substantial differential frequency discrimination) over a selected frequency sub-range of the first stage tuning range, which sub-range includes part or all of the entire tuning range.

In a second signal processing state of the second stage 201, at least one LC tank-based circuit is activated, and the second stage manifests substantial frequency discrimination over the selected frequency sub-range; that is, a minimum magnitude of the associated transfer function of the second stage is a relatively small fraction (e.g., at most 50 percent) of the maximum magnitude of the associated transfer function of the second stage within the selected frequency sub-range. In this second state, the second stage 201 discriminates strongly in favor of one or more frequency components that approximately coincide with a reference frequency $f_{ref}$ at which the transfer function magnitude achieves an approximately maximum value, and against frequencies (including VCO noise) outside this sub-range. This reference frequency is related to the target frequency f0 by a relation $f_{ref}=N\cdot f0$, where N is a selected integer or rational number at least equal to 1. The second stage 201 has one or two output signal terminals, 211A and/or and 211B, that provide a processed output signal $S_0(t)$ for the system 11.

Figure 2:
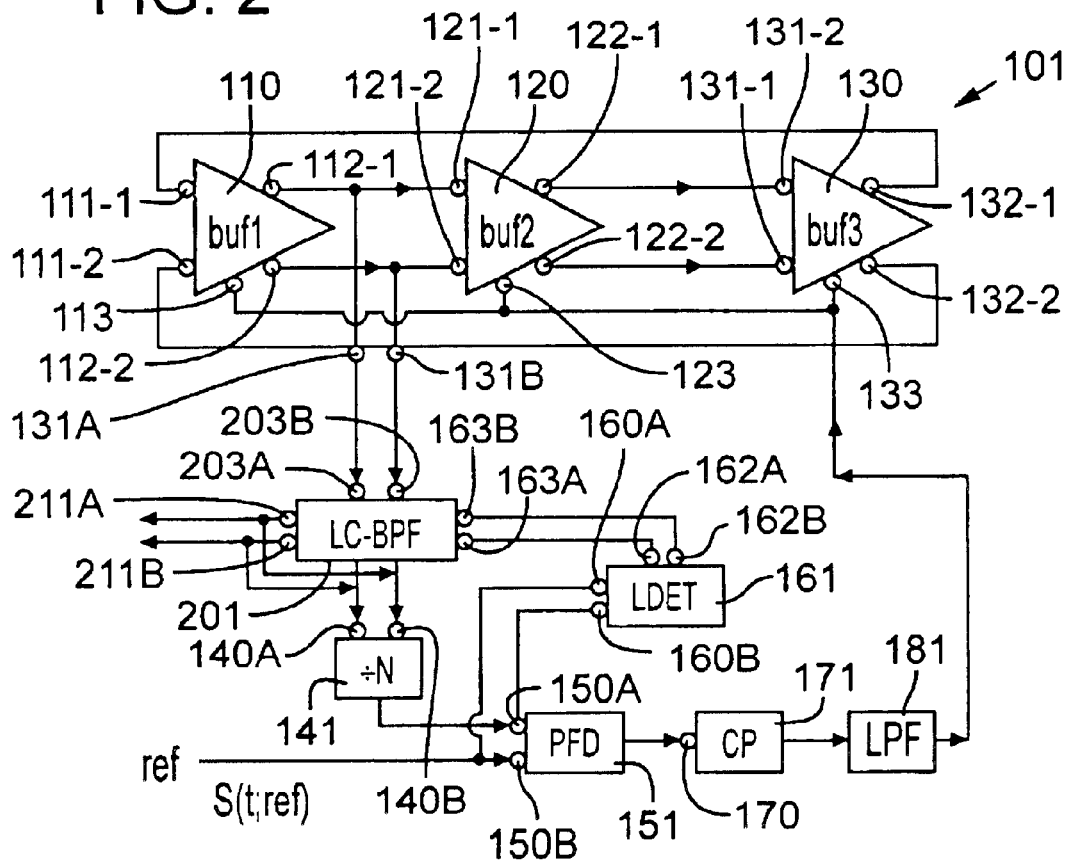
FIGS. 2 and 3 illustrate schematically first and second stages of one embodiment of the invention.

FIG. 2 schematically illustrates a ring-based VCO mechanism 101 and accompanying signal processing modules for achieving signal acquisition and lock over a broad tuning range. The VCO mechanism 101 includes three or more signal buffers, 1m0 (m=1, 2, 3), each having two input terminals 1m1-1 and 1m1-2, and having two output terminals, 1m2-1 and 1m2-2, with the output terminals of the buffers 110, 120 and 130 being connected to the corresponding input terminals of the respective buffers 120, 130 and 110. Signals from a pair of buffer output terminals, for example, 112-1 and 112-2 associated with the first signal buffer 110, are received at first and second input terminals of a bandpass filter system 201, which is disclosed in more detail in FIG. 3. Other VCO mechanisms are discussed by F. M. Gardner. *Phaselock Techniques*, John Wiley & Sons, New York, Second Edition, 1979, p. 95, and by W. F. Egan. *Phase-lock Basics*, John Wiley & Sons, New York, 1998, pp. 44–47. Gardner. op cit, notes that a PLL system often acts as a high pass filter, suppressing lower frequency signals and passing higher frequency signals.

Signals appearing on two intermediate output terminals, 211A and/or 211B, of the bandpass filter system 201 are received at two intermediate input terminals, 140A and 140B, of a frequency divider 141 (optional) that reduces the reference frequency $f_{ref}$ of the bandpass filter system output signal by a multiplicative factor of N, where N is a selected integer (including 1) or rational number at least equal to 1. The frequency divider 141 issues a frequency divider output signal, with a target frequency $f0=f_{ref}/N$, that is received at a first input terminal 150A of a phase and frequency detector (PFD) 151. A second input terminal 150B of the FPD 151 receives a reference signal S(t;ref) that provides a target frequency and/or a target phase for a desired signal. The frequency divider output signal and the reference signal are also received at first and second input terminals, 160A and 160B, of a phase and frequency lock detector 161. When the phase and/or the frequency of the frequency divider 141 is substantially equal to the phase and/or frequency of the reference signal S(t;ref), the phase and frequency lock detector 161 issues a lock signal at one or more lock output terminals, 162A and 162B. The lock output signal(s) is received at two or more MOS transistor gates 213GA, 213GB, 223GA and 223GB in FIG. 3 and is used to switch the bandpass filter system 201 between a first state and a second state, as discussed in connection with FIG. 3. The polarity of the lock output signal corresponding to the first state and to the second state will depend upon which of the MOS transistor gates, 213GA, 213GP, 223GA and 223GB, is of n-type and which is of p-type.

An output signal from the PFD 151 is received at an input terminal 170 of a charge pump mechanism 171 that optionally serves as part of a phase detector. Use of a charge pump, an Exclusive OR gate, or an RS flip flop as part of a phase detector is discussed by W. F. Egan, op cit, pp. 31–35.

An output signal from the charge pump mechanism 171 is received and passed through a low pass filter system 181, and an LPF output signal from the low pass filter system is received at one or more frequency adjustment input terminals, 113, 123 ad/or 133, of the respective first, second and third signal buffers, 110, 120 and 130. The bandwidth of the bandpass filter system 201 should be at least as large as, and preferably larger than, the bandwidth of the low pass filter system 181.

In a first state, the bandpass filter system 201 is substantially transparent, except for a possible change in output voltage amplitude and polarity. In a second stage, which is implemented after a frequency lock signal is received by the system 201 from the lock detector 161, the bandpass filter system serves as a resonant frequency circuit having an associated Q factor of the order of 10 or less and with substantial frequency discrimination: all frequencies that differ substantially from a reference frequency $f_{ref}$ are attenuated by a large factor so that only frequency components near the reference frequency survive.

Figure 3:
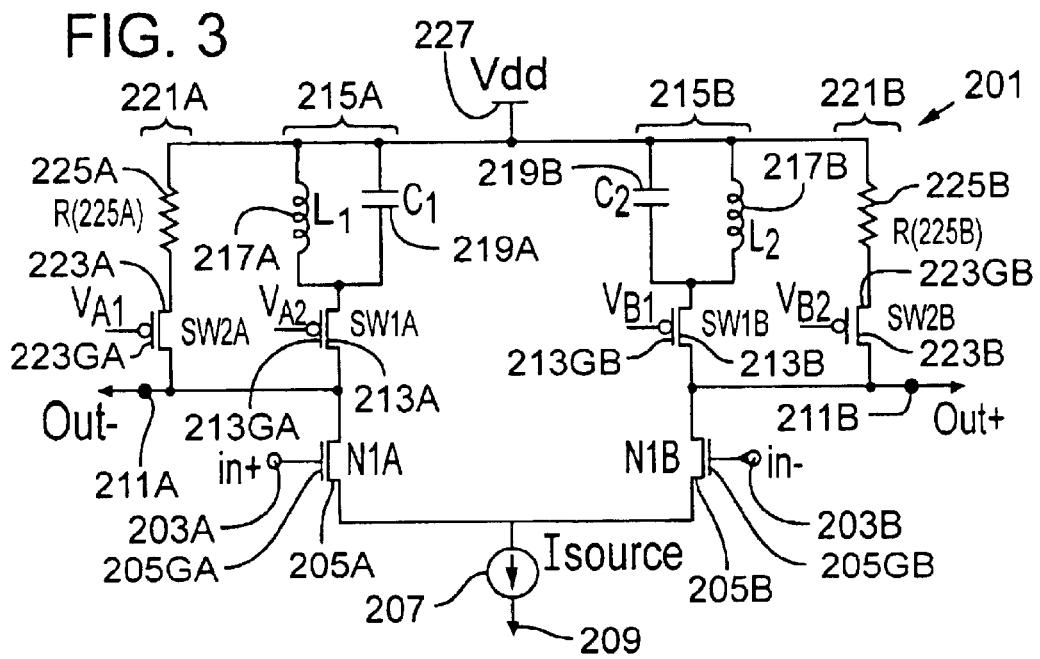

FIG. 3 schematically illustrates an embodiment of the bandpass filter system 201 of the system according to the invention. This embodiment of the bandpass filter system 201 includes one or more signal input terminals, 203A and 203B, connected to corresponding gates, 205GA and 205GB, of first and second MOS transistors, 205A and 205B, that are independently switchable between a conducting state, in which the transistor conducts current, and a non-conducting state, in which the transistor conducts substantially zero current. The drain (or source) of each of the first and second MOS transistors, 205A and 205B, is connected through a current source 207 to a ground potential source 209. The source (or drain) of each of the first and second MOS transistors, 205A and 205B, is connected to an output terminal, 211A and/or 211B, respectively, of the bandpass filter system 201.

The output terminal 211A is connected to a drain of a third MOS transistor 213A, having a gate 213GA, and a source of the third transistor 213A is connected to a first LC tank circuit 215A. The first LC tank circuit 215A includes an inductor 217A and a capacitor 219A, arranged in parallel, having selected circuit parameter values, and both being connected to a selected voltage source 227 ($V_{dd}$). The source of the first transistor 205A is also connected to a first end of a circuit 221A including a fourth MOS transistor 223A and a first resistor 225A, arranged in series; and this series circuit is also connected at a second end thereof to the voltage source 227.

The third and fourth MOS transistors, 213A and 223A, have respective gates, 213GA and 223GA, that are driven by coordinated applied voltages, VA1 and VA2, respectively, received from the lock detector 161 (FIG. 2) so that at most one of the third transistor 213A and the fourth transistor 221A is conducting at any time. If the third and fourth transistors, 213A and 223A, are of the same type (i.e., both p-type or both n-type), the applied voltages, VA1 and VA2, are opposite to each other (e.g., one high and one low) in one version of this embodiment. If the third and fourth transistors, 213A and 223A, are of opposite types (i.e., one p-type and one n-type), the applied voltages, VA1 and VA2, may be the same (e.g., both high or both low). With this configuration, at most one of the LC tank-based circuit 215A and the series circuit 221A is conducting at any time. When the circuit 221A is conducting (circuit 213A non-conducting), this portion of the bandpass filter system 201 behaves as a simple resistive ladder with a corresponding transfer function $$TRF(f,1)=R(205GA)/\{R(205GA)+R(223GA)+R(225A)\} \quad (1)$$

and does not introduce any substantial frequency discrimination. When the circuit 215A is conducting (circuit 221A is non-conducting), this portion of the bandpass filter system 201 behaves as an LC tank circuit with a transfer function having substantial frequency discrimination:

$$TRF(f;2)=R(205GA)/\{R(205GA)+R(213GA)-j2\pi fL/((2\pi f)^2 LC-1)\}. \quad (2)$$

The circuit 215A preferably has an associated Q factor no larger than about 10.

A second portion of the bandpass filter system 201 includes a fifth MOS transistor 213B having a fourth gate 213GB, the second output terminal 211B, a fifth MOS transistor 213B, a second LC tank-based circuit 215B, a second inductor 217B, a second capacitor 219B, a sixth MOS transistor 223B, a second resistor 225B, arranged analogously to the corresponding circuit components in the first portion of the bandpass filter system 201.

The fifth and sixth transistors, 213B and 223B, have respective gates, 213GB and 223GB, that are driven by coordinated applied voltages, VB1 and VB2, respectively, received from the lock detector 161 (FIG. 2) so that at most one of the fifth transistor 213B and the sixth transistor 223B is conducting at any time. If the fifth and sixth transistors, 213B and 223B, are of the same type (i.e., both p-type or both n-type), the applied voltages, VB1 and VB2, are opposite to each other (e.g., one high and one low) in one version of this embodiment. If the third and fourth transistors, 213B and 223B, are of opposite types (i.e., one n-type and one p-type), the applied voltages, VB1 and VB2, may be the same (e.g., both high or both low). With this configuration, at most one of the LC tank-based circuit 215B and the series circuit 221B is conducting at any time. When the circuit 221B is conducting (circuit 213B non-conducting), this portion of the bandpass filter system 201 behaves as a simple resistive ladder with a corresponding transfer function $$TRF(f;3)=R(205GB)/\{R(205GB)+R(223GB)+R(225B)\} \quad (3)$$

and does not introduce any substantial frequency discrimination. When the circuit 215B is conducting (circuit 221B is non-conducting), this portion of the bandpass filter system 201 behaves as an LC tank circuit with a transfer function having substantial frequency discrimination:

$$TRF(f;4)=R(205GB)/\{R(205GB)+R(213GB)-j2\pi fL/((2\pi f)^2 LC-1)\} \quad (4)$$

The circuit 215B preferably has an associated Q factor no larger than about 10. Preferably, the conducting states of the third and fifth transistors, 213A and 213B, are coordinated and the conducting states of the fourth and sixth transistors, 223A and 223B, are coordinated.

A PLL system for a signal transmitter and a PLL system for a signal receiver may have somewhat different parameter values, depending upon the environment of the transmitter or receiver, but the configuration for each of these systems is substantially as shown in FIGS. 1, 2 and 3.

Optionally, an output signal for the bandpass filter system 201 is a difference between two voltage signals, such as the signals appearing at the output terminals 211A and/or 211B.

What is claimed is:

1. A phase-locked loop (PLL) comprising:
   a voltage-controlled oscillator (VCO) operable to generate an output signal in response to an input signal;
   a bandpass filter coupled to the VCO and operable to pass a portion of the VCO output signal that is within a limited frequency band around a reference signal; and
   a detector circuit responsive to the VCO output signal and the reference signal, the detector circuit operable to activate the bandpass filter to pass the portion of the VCO signal after detecting that the VCO output signal is within the limited frequency band,
   wherein the VCO is operable to produce a differential output signal and the bandpass filter is operable to pass the differential output signal.

2. The PLL of claim 1 wherein the bandpass filter is operable in a first processing state to pass the VCO output signal without substantial filtering and operable in a second processing state to pass the portion of the VCO output signal that is within the limited frequency band.

3. The PLL of claim 2 wherein the bandpass filter includes an LC tank circuit and a resistor, the bandpass filter operable in the first processing state to pass the VCO output signal through the resistor and operable in the second processing state to pass the VCO output signal through the LC tank circuit.

4. The PLL of claim 1 wherein the bandpass filter is operable to pass the portion of the VCO output signal if the output signal is detected within one of a number of limited frequency bands each associated with a reference signal of different frequency.

5. A phase-locked loop (PLL) comprising:
   a voltage-controlled oscillator (VCO) operable to generate an output signal in response to an input signal;
   a bandpass filter coupled to the VCO and operable to pass a portion of the VCO output signal that is within a limited frequency band around a reference signal, and
   a detector circuit responsive to the VCO output signal and the reference signal, the detector circuit operable to activate the bandpass filter to pass the portion of the VCO output signal after detecting that the VCO output signal is within the limited frequency band,
   wherein the bandpass filter is operable to pass the portion of the VCO output signal if the output signal is detected within one of a number of limited frequency bands each associated with a reference signal of different frequency and wherein the bandpass filter includes multiple LC tank circuits in parallel.

6. The PLL of claim 1 wherein the VCO is a ring-based VCO.

7. The PLL of claim 1 including a phase and frequency detector circuit separate from the detector circuit and operable to compare the VCO output signal to the reference signal.

8. A phase-locked loop (PLL) comprising:
   a voltage-controlled oscillator (VCO) operable to generate an output signal in response to an input signal;
   a phase and frequency detector (PFD) operable to compare the VCO output signal to a reference signal;
   a bandpass filter coupled between the VCO and the PFD and operable in a first processing state to pass the VCO output signal to the PFD without substantial filtering and operable in a second processing state to pass only the portion of the VCO output signal that is within a limited frequency band around the reference signal to the PFD; and
   a detector circuit responsive to the VCO output signal and the reference signal, the detector circuit operable to switch the bandpass filter from its first processing state to its second processing state after detecting that the VCO output signal is within the limited frequency band.

9. A method for limiting jitter in a phase-locked loop (PLL), the PLL including a voltage-controlled oscillator (VCO) and a phase and frequency detector (PFD) for comparing the PLL reference signal to a VCO differential output signal, the method comprising:
   monitoring the VCO differential output signal and the PLL reference signal;
   detecting when the VCO differential output signal is within a limited frequency band around the PLL reference signal; and
   in response to such detection, filtering the VCO differential output signal to pass a portion of the VCO differential output signal within the limited frequency band to the PFD.

10. The method of claim 9 including passing the VCO differential output signal to the PFD without substantial filtering if the VCO differential output signal is not detected within the limited frequency band.

11. The method of claim 9 wherein filtering the VCO differential output signal to pass a portion of the VCO differential output signal comprises passing the VCO differential output signal through an LC tank circuit.

12. The method of claim 9 including passing the VCO differential output signal through a bandpass filter operable in a first processing state to pass the VCO differential output signal to the PFD without substantial filtering and operable in a second processing state to filter the VCO differential output signal to pass the portion of the VCO differential output signal that is within the limited frequency band to the PFD.

13. A phase-locked loop (PLL) comprising:
- a voltage-controlled oscillator (VCO) operable to generate an output signal in response to an input signal;
- a detector circuit operable to detect whether the VCO output signal is within a limited frequency band of a reference signal; and
- a bandpass filter coupled to the VCO and responsive to the detector circuit, the bandpass filter operable in response to such detection to pass a portion of the VCO output signal that is within the limited frequency band around the reference signal, wherein the bandpass filter is operable in a first processing state to pass the VCO output signal without substantial filtering and operable in a second processing state to pass the portion of the VCO output signal that is within the limited frequency band.

14. The PLL of claim 13 including a phase and frequency detector (PFD) separate from the detector circuit.

15. The PLL of claim 13 wherein the bandpass filter is operable to pass the portion of the VCO output signal is the VCO output signal is detected within one of a number of limited frequency bands each associated with a reference signal of a different frequency.

16. A method for limiting jitter in a phase-locked loop (PLL), the PLL including a voltage-controlled oscillator (VCO), the method comprising:
- monitoring the VCO output signal and a PLL reference signal;
- detecting if the VCO output signal is within a limited frequency band around the PLL reference signal;
- in response to such detection, filtering the VCO output signal to pass a portion of the VCO output signal within the limited frequency band; and
- passing the VCO output signal without substantial filtering if the VCO output signal is not detected within the limited frequency band.

17. The method of claim 16 wherein the PLL reference signal can be one of a number of different frequencies.

* * * * *

UNITED STATES PATENT AND TRADEMARK OFFICE
CERTIFICATE OF CORRECTION

PATENT NO. : 6,825,733 B1
DATED : November 30, 2004
INVENTOR(S) : Ming Qu et al.

It is certified that error appears in the above-identified patent and that said Letters Patent is hereby corrected as shown below:

Column 8,
Line 4, "is" should be -- if --.

Signed and Sealed this

Twenty-fourth Day of May, 2005

JON W. DUDAS
*Director of the United States Patent and Trademark Office*